United States Patent [19]

Patterson et al.

[11] Patent Number: 5,147,210
[45] Date of Patent: Sep. 15, 1992

[54] POLYMER FILM INTERCONNECT

[75] Inventors: Timothy P. Patterson, Costa Mesa; Carl E. Hoge, Encinitas, both of Calif.

[73] Assignee: Western Digital Corporation, Irvine, Calif.

[21] Appl. No.: 769,475

[22] Filed: Oct. 1, 1991

Related U.S. Application Data

[63] Continuation of Ser. No. 568,543, Aug. 15, 1990, abandoned, which is a continuation of Ser. No. 425,492, Oct. 19, 1989, abandoned, which is a continuation of Ser. No. 163,793, Mar. 3, 1988, abandoned.

[51] Int. Cl.$^5$ .............................................. H01R 9/09
[52] U.S. Cl. .......................................... 439/91; 29/830; 29/832; 156/273.9
[58] Field of Search .................. 29/830, 831, 840, 884, 29/832; 439/66, 91, 591, 68, 69, 71; 361/398, 403, 413, 414, 400, 401, 408, 407; 228/180.2; 156/273.9, 629, 630, 901, 902; 174/84 R, 88 R

[56] References Cited

U.S. PATENT DOCUMENTS

| | | | |
|---|---|---|---|
| 3,107,414 | 10/1963 | Sterling | 29/830 |
| 3,320,658 | 5/1967 | Bolda et al. | 228/249 |
| 3,680,037 | 7/1972 | Nellis et al. | 29/884 |
| 4,184,729 | 1/1980 | Parks et al. | 29/830 |
| 4,215,387 | 7/1980 | Negishi et al. | 361/398 |
| 4,705,205 | 11/1987 | Allen et al. | 228/180.2 |
| 4,740,657 | 4/1988 | Tsukagoshi et al. | 174/94 R |
| 4,759,970 | 7/1988 | Seeger, Jr. et al. | 174/68.5 |
| 4,783,815 | 11/1988 | Buttner | 156/902 |
| 4,811,081 | 3/1989 | Lyden | 357/80 |
| 4,874,721 | 10/1989 | Kimura et al. | 29/830 |

OTHER PUBLICATIONS

Tecknit, Data Sheet CEC-011, Conductive Elastomeric Connector, Jul. 1974.

*Primary Examiner*—Neil Abrams
*Attorney, Agent, or Firm*—Christie, Parker & Hale

[57] ABSTRACT

A polymer film interconnect forms an electrical interconnect between a first pattern of electrical conductors on a first electrical component and a second pattern of electrical conductors on a second electrical component. The polymer film interconnect includes a thin, flexible, self-supporting dielectric polymeric film having a pattern of spaced apart thru-holes containing separate quantities of an electrically conductive bonding material capable of heat bonding to the first electrical conductors adjacent the first surface of the film and to the second conductors adjacent the second surface of the film. This provides a plurality of discrete electrically isolated conductive paths from the first pattern of electrical conductors through the film to the second pattern of electrical conductors on the opposite side of the film. The polymer film interconnect can be used for forming interconnects between a number of electrical components, including connections between an IC chip and a leadframe or spreader; an IC chip and a chip carrier; an IC chip and a circuit board; an IC chip carrier and a circuit board; and a spreader or leadframe and a circuit board.

14 Claims, 2 Drawing Sheets

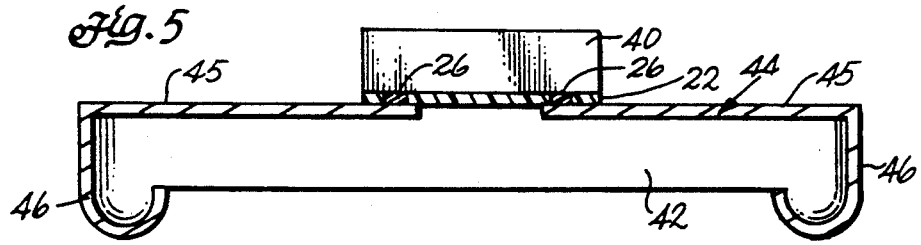
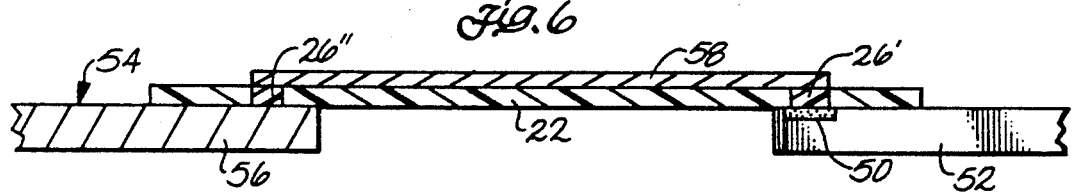
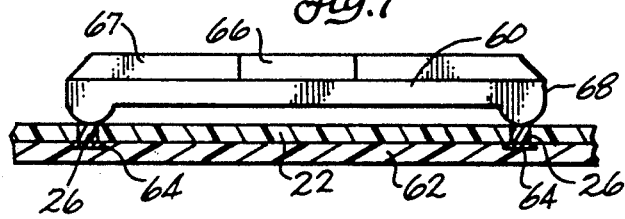
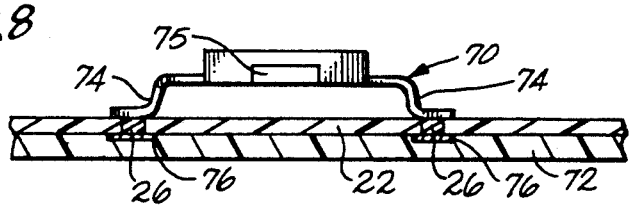
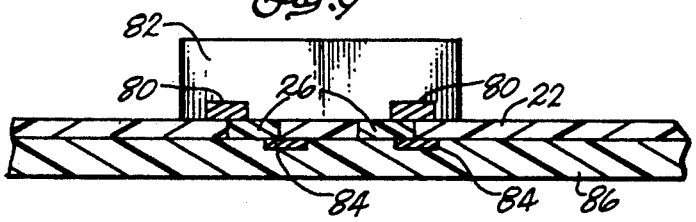
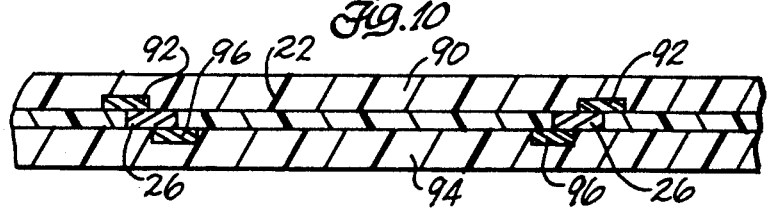
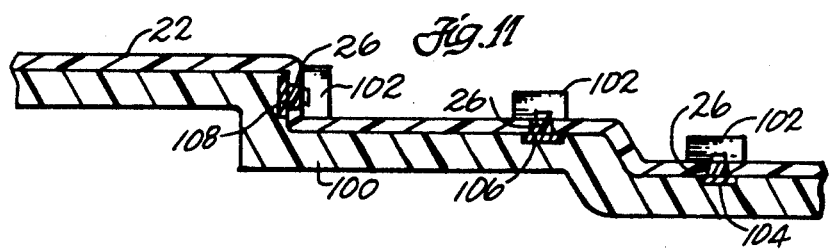

POLYMER FILM INTERCONNECT

This is a continuation of Ser. No. 568,543, filed Aug. 15, 1990, abandoned, which is a continuation of Ser. No. 425,492, filed Oct. 19, 1989, abandoned, which is a continuation of Ser. No. 163,793, filed Mar. 3, 1988, abandoned.

FIELD OF THE INVENTION

This invention relates to techniques for forming interconnects between electrical components, and more particularly, to a polymer film interconnect used for interconnecting various combinations of components such as integrated circuits.

BACKGROUND OF THE INVENTION

Several techniques have been developed in the past for electrically interconnecting various integrated circuit (IC) components. For example, IC chips have been connected to leadframes, package housings, or substrates such as printed circuit boards (PCB's), using such techniques as wire bonding, Tape Automated Bonding (TAB) and solder bumps. These and other prior art interconnects have limitations or disadvantages which are overcome by the present invention. The following background describes these prior art interconnects in order to provide a better understanding of some of the improvements resulting from the present invention.

Wire bonding is by far the most widely used technique for interconnecting silicon devices. For low lead count integrated circuits (less than 100 I/O's), bond pads located on the periphery of the chip rarely influence the dimensions of the thin silicon slab. However, integrated circuits requiring more I/O's often have their exterior dimensions determined not by the active circuitry embedded in the silicon, but rather, by the number of bond pads required to make contact to the leadframe, package housing, or substrate.

Typically, for an IC having a certain lead pitch, there is a minimum chip size required to provide a given number of I/O's. Often the active electronic structures contained within the silicon require dimensions considerably smaller than those dictated by the I/O requirements. As a result, the integrated circuit must be fabricated to a size larger than required by the active electronic structures. This reduces the number of chips per wafer and, therefore, increases the cost per die.

To overcome this problem for high lead count devices, TAB and solder bump interconnects are often used. TAB interconnects can presently be configured at a pitch of four mils, which reduces the effective chip size for interconnection by approximately one-half (two mil pads and two mil spaces) when compared with wire bonding.

Solder bumps, which provide direct interconnection from IC's to substrates or packages, can be located anywhere within the silicon surface. This geometry permits fabrication in a so-called area format, which provides the maximum number of I/O's for a given chip edge dimension. Recently, TAB has also been fabricated in an area format. However, in both cases nonstandard (other than aluminum) metallization is required on the bond pads.

Inasmuch as both TAB and solder bumps require complex chip processing and custom interconnects (leadframes and/or substrates), their use to date has been confined to specialized applications. Therefore, neither of these techniques has replaced use of wire bonds for interconnecting high lead count silicon devices to various components such as substrates or packages.

Thus, the prior art has provided a number of techniques for forming electrical interconnects, but all have limitations or disadvantages.

SUMMARY OF THE INVENTION

Briefly, this invention provides a polymer film interconnect for forming electrical interconnects between patterns of electrical conductors on the surfaces of various electrical components. The polymer film interconnect includes a thin, flexible, self-supporting dielectric polymeric film having a pattern of spaced apart plugs of electrically conductive bonding material contained in thru-holes extending through the film. The film is used as an interface between the electrical components to be connected. The plugs of bonding material and the surface of the film adhere to any surfaces of the components contacted by the film. Thus, the plugs of conductive bonding material adhere to the patterns of electrical conductors on the electrical components adjacent opposite faces of the film. The opposite surfaces of the film are also capable of adhering to the nonconductive surfaces of the components. Preferably, adhesion between all contacting surfaces is provided by thermal bonding techniques. The pattern of conductive plugs is simply aligned with the patterns of conductors on the respective components, and external heat is then applied to bond all contacting surfaces in one operation. The resulting interconnect provides a plurality of separate electrically isolated conductive paths from the pattern of conductors on one component through the film to the pattern of conductors on the component on the opposite side of the film.

The polymer film interconnect provides a versatile means of interconnecting electrical components. The film can be heated more than once when forming interconnects; and components can be interconnected simultaneously or sequentially, by applying heat in one operation when interconnecting two components, or by applying heat to bond the film to one component and later heat bonding it to the other component.

The polymer film interconnect is adaptable for forming interconnects between various electrical components including, but not limited to, connection of IC chips to leadframes, spreaders, chip carriers, or substrates such as circuit boards; connection of IC chip carriers, leadframes or spreaders to substrates such as circuit boards or housings; and connection of contacts on one substrate to contacts on another substrate. When using the polymer film interconnect, many of these interconnects can be made in a way that eliminates several additional interconnects or interfaces commonly required by prior art interconnect techniques. This results in greater reliability and a cost savings.

The invention also avoids other disadvantages of prior art interconnect techniques such as wire bonding, TAB and solder bump techniques. The film can provide interconnects in high lead counts for I/O's located at the periphery of the integrated circuit device or in an area format. Therefore, the invention does not unreasonably limit the minimum allowable dimensions of the components. Specialized processing and customized interconnects commonly associated with TAB and solder bump techniques are also eliminated.

These and other aspects of the invention will be more fully understood by referring to the following detailed description and the accompanying drawings.

BRIEF DESCRIPTION OF THE DRAWINGS

FIG. 5 is a schematic cross-sectional view illustrating connection of an IC chip to a chip carrier;

FIG. 6 is a fragmentary schematic cross-sectional view illustrating a double via connection between a leadframe and an IC chip;

FIG. 7 is a schematic cross-sectional view illustrating connection of an IC chip carrier to a substrate;

FIG. 8 is a fragmentary schematic cross-sectional view illustrating connection of a leadframe to a substrate;

FIG. 9 is a fragmentary schematic cross-sectional view illustrating connection of a pattern of electrical terminals on an IC chip to a different pattern of electrical terminals on a substrate;

FIG. 10 is a fragmentary schematic cross-sectional view illustrating connection of a pattern of electrical conductors on one substrate to a different pattern of electrical conductors on another substrate; and FIG. 11 is a fragmentary schematic cross-sectional view illustrating connection of electrical components to a board having a complex topography.

DETAILED DESCRIPTION

Figure 1:
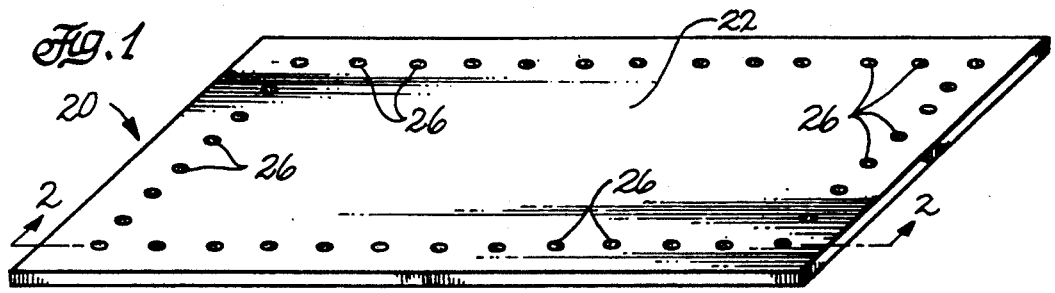
FIG. 1 is a semi-schematic perspective view illustrating a polymer film interconnect according to principles of this invention.
Figure 2:
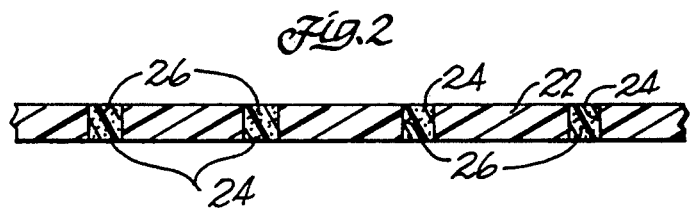
FIG. 2 is a fragmentary schematic cross-sectional view taken on line 2—2 of FIG. 1.

FIGS. 1 and 2 illustrate a polymeric interconnect film 20 for providing electrical interconnects between patterns of electrical conductors on various combinations of electrical components to be described in more detail below. The interconnect film includes a thin, flat, unsupported but self-supporting, flexible dielectric polymeric film sheet 22. The film 22 can be several mils in thickness. Approximately four mils thickness is preferred. The polymeric film can comprise either a thermoplastic material or a B-stage thermoset material.

A plurality of mutually spaced apart holes 24 extend through the entire depth of the film so that the holes are open to the top and bottom faces of the film. The holes 24 are filled with separate quantities of an electrically conductive bonding material 26, thereby forming a pattern of mutually spaced apart electrically conductive filled thru-holes or plugs communicating between opposite faces of the film. The bonding material 26 is preferably a polymeric bonding material, which can be a B-stage thermoset resin such as an epoxy resin, or a thermoplastic resin. The resinous bonding material is filled with metal particles to provide electrical conductivity. Alternatively, the thru-holes can be filled with a metal having good electrical conductivity, although it is preferred to use an electrically conductive polymeric bonding material. The filled thru-holes 26 are referred to herein as conductive plugs.

The holes 24 in the film can either be circular in shape, or have other shapes such as squares, hexagons, octagons, etc. The hole size is preset to match the dimensions of electrically conductive terminals such as bond pads on the electrical components to be bonded to the conductive plugs 26 according to techniques described below. The holes also are arranged on the film in any desired pattern to match the pattern of spaced apart electrical conductors on the surfaces of the electrical components interconnected by the film as described below.

The conductive bonding material 26 contained in the thru-holes can comprise any suitable material capable of providing adhesion between the electrical conductors or terminals on the electrical components to be interconnected by the film. Advantages are provided when using polymeric bonding materials in the thru-holes of the dielectric film. Bonding can be carried out at reasonably low temperatures, substantially lower than the heat tolerance limits of the components being interconnected.

The dielectric film 22 also can be made from any suitable material capable of providing surface adhesion between opposite faces of the film and the adjacent surfaces of the electrical components in contact with the film. The film acts as an electrical isolation medium for the pattern of conductive plugs 26. The film also acts as a carrier for the conductive plugs in the sense that it provides a means of supporting the plugs in a preset pattern.

As mentioned previously, the film is used as an interface for connecting one electrical component to another electrical component. The plugs of bonding material are adhered to the patterns of contacts, terminals or other electrical conductors on the electrical components being connected. The surface of the film is adhered to at least one of the nonconductive surfaces of the electrical components being connected. In instances where the patterns of conductors are in the same plane as the nonconductive exterior surfaces of both components, the surfaces of the film are adhered to both adjoining surfaces of the components. In instances where the conductors project away from the nonconductive surface of the component, the plugs are adhered to the conductors only.

The polymeric materials used for the film and the conductive plugs can provide the necessary level of adhesion by heat curing, fusion, solvent evaporation, softening and rehardening, or other bonding techniques suitable for producing a reliable bond during normal use of the interconnected electrical components. The bond produced is preferably a mechanical and chemical bond.

The film and conductive plugs are preferably bonded to the adjacent surfaces of the components and the pattern of conductors thereon by externally applied heat. Moreover, the film and the conductive plugs are thermally compatible so that adhesion to the surface of the component and the pattern of conductors thereon is produced in a single processing step under the same or similar bonding temperatures.

As mentioned previously, the film 22 and the conductive plugs 26 can be thermoplastic or B-stage thermosetting polymeric materials. For thermoplastic materials, heat is applied at the softening temperatures of the film and conductive plugs to embed the contacting surface of the component and its pattern of conductors in the film and pattern of conductive plugs, respectively.

Upon subsequent cooling and rehardening, adhesion is produced to form the interconnect. The desired thermoplastic materials for the film and the conductive plugs are selected to provide the suitable level of adhesion, including the desired chemical bond. Use of thermoplastic materials allows heating and reheating of the film so that the film 22 and plugs 26 can be aligned and later re-aligned with the interconnected component and its conductors if necessary.

For B-stage thermosetting materials, the B-stage resins begin to cure or harden under the externally applied heat, simultaneously forming a bond between the contacting surfaces of the film and the component and between the patterns of conductive plugs and conductors. The thermoset materials are selected so that curing produces a mechanical and chemical bond. Heat can be applied in stages, to pre-bond the film to the component with an initial level of heat and to later provide final curing with additional applied heat, usually at a higher temperature.

Figure 3:
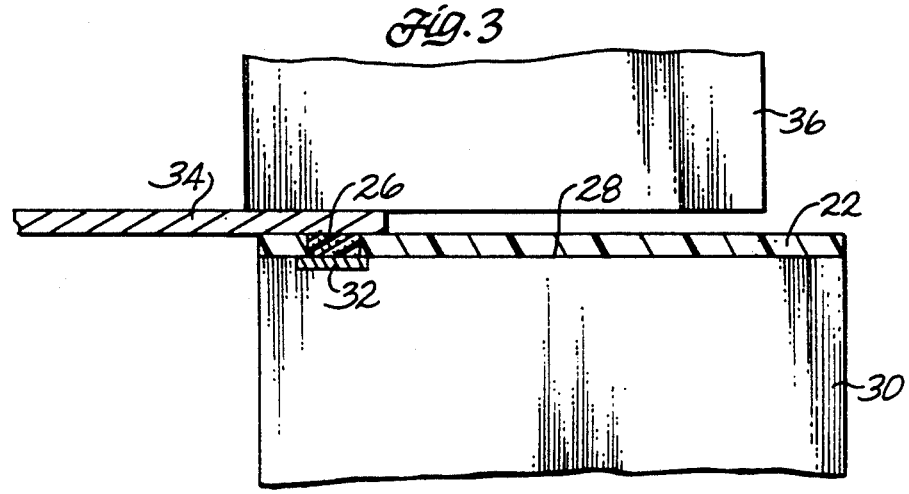
FIG. 3 is a fragmentary semi-schematic elevation view, partly in cross section, illustrating a technique for bonding a leadframe to an IC chip using the polymer film interconnect techniques of this invention.
Figure 4:
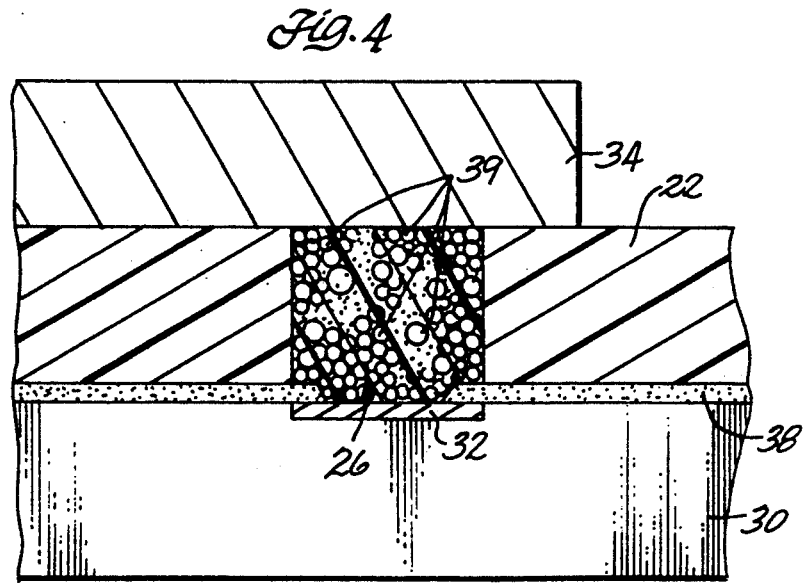
FIG. 4 is a fragmentary schematic cross-sectional view enlarged in size to illustrate bonding of electrical components with the polymer film interconnect.

FIGS. 3 and 4 schematically illustrate one application of the dielectric film for interconnecting electrical terminals on a pair of electrical components. In this embodiment, the film is used to interconnect an IC chip and a leadframe. The components may be interconnected either sequentially or simultaneously. Sequential bonding will be described in the following example. The underside of the dielectric film 22 is first bonded to a silicon IC chip under externally applied heat, thereby forming an electrical bond between the pattern of conductive plugs 26 in the film and the I/O's of the silicon device. The film 22 is shown adhered to a top surface 28 of the IC chip 30. The IC chip has a pattern of I/O's (one I/O is shown at 32) which become bonded to the corresponding pattern of the conductive plugs 26 in the film 22. Following the initial step of heat bonding the film to the IC chip, the IC chip and the attached film are then aligned with a thin metal leadframe 34, and heat is then applied to bond the leadframe to the film. The upper surface of the film 22 is shown bonded to the leadframe 34 which becomes embedded in a portion of the film 22 during the second heat bonding step. Only one leadframe terminal 34 is shown for simplicity. In practice, a plurality of leadframe terminals is separately bonded to the corresponding pattern of conductive plugs 26 so that each leadframe terminal is electrically connected and bonded to a corresponding I/O pad.

FIG. 3 illustrates one technique which can be used for applying heat to obtain the adhesion provided by the polymer film interconnect. After the film 22 is placed on the silicon IC chip 30 to align the plugs 26 directly above the bond pads 32 on the die, the leadframe 34 is aligned over each plug 26. No additional processing of the silicon chip is required to achieve an ohmic contact between the film and the bondpad of the chip. A heated tool 36 is then pressed onto the leadframe 34. The heat from the tool softens the film 22, causing the leadframe to become embedded in the film. Simultaneously, an electrical connection is formed between the leadframe and the I/O bond pads 32 on the silicon device by means of the conductive bonding material 26 in the filled thru-holes. During this step, if the resin in the thru-holes is an epoxy or other thermosetting material, the B-stage resin begins to cure (harden) while simultaneously forming a bond to both the leadframe 34 and the I/O bond pad 32. If the bonding material 26 in the thru-holes 24 is a thermoplastic polymeric material, it softens to embed the leadframe and I/O pad in the bonding material at the leadframe-resin-bond pad interfaces.

Simultaneously during the heating operation, the dielectric film either cures, if a thermoset; or it softens until the heat is removed, if a thermoplastic. After the heated tool is removed, the polymeric material cools and hardens and all I/O's on the IC chip have been bonded to the leadframe by the conductive plugs.

The temperatures at which the bonding step or steps are carried out are substantially below the heat tolerance limits of the electrical components being interconnected.

Thus, the step of interconnecting all conductors on a component to an electrical interface can take place in a single operation of applying external heat. Moreover, the entire pattern of electrical conductors on a pair of components can be bonded and electrically connected simultaneously. The heat required to activate the bonding material(s) is applied in one step, such as by a single heated tool or by heating in an oven, for example. Any customizing to form the multiple interconnect is done by the pattern of electrical interconnects in the film 22, rather than by separate customizing of the electrical components themselves.

FIG. 4 schematically illustrates, as an example, an enlarged cross section of the silicon chip 30 interconnected by the electrically conductive resin in the conductive plug 26. Intimate adhesion is achieved between the resin and its conductive material and the surfaces to which the resin is bonded. FIG. 4 also shows the chip passivization layer 38 to which the polymer film 22 is bonded, and the metal particles 39 embedded in the resin. The particle size of the conductive filler particles 39 is appreciably smaller than the feature size of the bond pad 32. The filler material preferably comprises silver particles, although it also can be composed of silver alloys such as silver-palladium, silver-copper, etc. Also, other noble filler materials such as gold or platinum may be used for specific applications.

In the process of making IC chips, the film 22 is preferably adhered to the entire surface of the wafer prior to sawing. Thus, each repeating silicon IC chip on the wafer has its I/O's replicated by the conductive plugs 26 in the film. Also, the leadframe normally can be configured in the form of a reel. Therefore, following bonding, the singulated silicon chips become part of the leadframe reel.

The following is a preferred technique for assembling a leadframe and an IC chip with the polymer film interconnect of this invention. This approach serves as an example of similar techniques for assembling other electrical components using the polymer film interconnect. As described previously, the polymeric film 22 is configured to match the size of the silicon wafer being processed. Each film has the pattern of plugs 26 corresponding to the pattern of I/O's on each repeating silicon chip of the wafer. The film with its pattern of conductive plugs is formed on an inert carrier and then stripped from the carrier and aligned over the wafer. After alignment, the film-wafer combination is run through a heated roller or rolled and then subjected to a short time exposure at an elevated temperature. This exposure by either means softens the film slightly and causes it to adhere to the wafer. Following the alignment step, the wafer is diced into individual circuits. The method of dicing can be conventional sawing or may consist of other methods such as laser or water cutting.

The singulated dice may be bonded to the leadframe as described previously. Following attachment, the dice can be post-cured, if necessary, electrically tested and burned-in.

Several methods can be used for forming the polymer film interconnect bonding material. If the dielectric film 22 is a thermoset material, the resin can be diluted in a solvent and cast onto a carrier sheet such as a polyester film. Following the casting step, the film is dried. In one embodiment the dry thickness of the film can range from about 3 to about 5 mils.

For thermoplastic materials, the polymer can be extruded into sheet form under applied temperature and pressure, or cast onto a carrier sheet from a solvent medium.

Thru-holes can be formed in the film by means of mechanical punching, or laser or water-jet drilling. Also, if the dielectric is chosen to be a photosensitive polymer, lithographic techniques can be used to form the thru-hole pattern.

Several methods are used for filling the thru-holes with the conductive resin. Screening and vacuum extrusion are desired. Screening includes use of a stencil mask through which the resin is squeezed into the thru-holes. In a vacuum extrusion, the resin is spread over the surface of the dielectric material and forced into the thru-holes by a roller or doctor blade.

In another embodiment, conductive metal plugs can be printed onto a carrier sheet and dried. Subsequently, a solution of resin and solvent can be cast around the plugs and dried to form the polymer film interconnect medium. The resulting film comprises a pattern of metal plugs extending entirely through the depth of the dielectric film. The film provides a carrier for the pattern of metal plugs to align them with a corresponding pattern or patterns of conductors on electrical components to be interconnected with the film. Sonic welding techniques can be used to subsequently form a bond between the metal plugs and the conductors, as well as the contacting surface of the film and the component.

The pattern of thru-holes 24 need not be formed in the film as a first step in the process. The dielectric film can first be adhered to the surface of an electrical component having a pattern of electrical conductors. The holes 24 then can be formed in the film (by laser drilling, for example) in alignment with the pattern of conductors. The thru-holes then can be filled with the conductive bonding material. This method can be used when critical alignment of the filled thru-holes and conductors is required.

FIGS. 5 through 11 illustrate uses of the polymer film interconnect of this invention for interconnecting various combinations of electrical components. The embodiments described in FIGS. 5 through 11 are simply examples, inasmuch as other combinations of electrical components can be interconnected as will be apparent from the description to follow.

FIG. 5 shows use of the film for bonding an IC chip 40 directly to an IC carrier or package 42. In this embodiment, the silicon chip is bonded to the package in a "chip-down" fashion, although a "chip-up" configuration also may be used for bonding an IC chip to an IC carrier or package. The underside of the IC chip 40 has a pattern of I/O bond pads (not shown) aligned with the conductive plugs 26 on the film 22. The film 22 can be initially adhered to the underside of the IC chip during assembly as described previously. The IC chip and film combination are then placed on the IC carrier 42, which may include a metal leadframe 44. In this embodiment, the leadframe has a pattern of conductive leads 45 fanning outwardly from a central region at the top of the carrier to a plurality of mutually spaced apart electrically isolated leads 46 extending along opposite side edges of the carrier. (The individual leads 45 and 46 are each continuous.) The leads 46 are shown in a J-lead configuration, although other leadframe configurations can be used. The conductive plugs 26 are aligned with corresponding conductive leads 45 on the leadframe and external heat is then applied to bond the plugs to the leads of the leadframe. The heating step can be accomplished using a heating implement as shown at 36 in FIG. 3 and described previously. Heat can be applied directly to the top of the IC chip 40 and transferred to the plugs 26 to activate the bonding material sufficiently to form the bond. The heat at which the bonding material is activated to produce the bond is substantially lower than the temperature the silicon chip can withstand. For instance, in one embodiment a silicon chip can withstand a temperature of 400° C., whereas a complete bond formed by applying heat indirectly through an IC chip to the conductive plugs can be achieved at a temperature below about 200° C. The heat bonding step forms a pattern of discrete electrically isolated conductive paths extending from corresponding I/O bond pads on the IC chip 40 through the film 22 to corresponding leads 46 on the IC chip carrier or package 42.

FIG. 6 illustrates use of the film for interconnecting a pattern of I/O bond pads 50 in an IC chip 52 and a corresponding pattern of leadframe terminals 54 in a leadframe 56. In this embodiment, the dielectric film 22 has a "double-via" configuration in which a first pattern of conductive plugs 26' matches the pattern of I/O bond pads 50 and a second pattern of conductive plugs 26" matches a different pattern of leadframe terminals 56. Each corresponding pair of conductive plugs 26' and 26" is interconnected by a corresponding metal conductor 58 carried by the film 22. The metallization can be plated, screened, sputtered, evaporated, or may consist of a separate leadframe or a separate film which is metallized and laminated to the conductive thru-hole patterns. FIG. 6 depicts the leadframe version of the polymer film interconnect. The geometry for the double-via film requires that the chips are picked and placed individually on to the film, since the film no longer matches the wafer geometry, but rather, matches the chip-package interconnect format. Again, as with other embodiments, external heat is applied for activating the resin in the conductive plugs 26' and 26" for bonding each metal conductor 58 to the corresponding I/O pads 50 and leadframe terminals 56 to form discrete spaced apart electrically conductive paths between each I/O bond pad and a corresponding leadframe terminal.

FIG. 7 schematically illustrates a further use of the film for interconnecting an IC chip carrier 60 to a substrate such as a PCB 62. The PCB can have a pattern of mutually spaced apart electrical contacts 64 facing upwardly from a surface of the PCB. The film 22 can first be attached to the PCB by overlaying the film on the PCB so that the pattern of conductive thru-holes 26 in the film is aligned with the pattern of contacts 64 on the PCB. Heat can then be applied to initially adhere it to the surface of the PCB. The IC chip carrier 60 can be similar to the chip carrier 42 shown in FIG. 5. It can include an IC chip 66 contained internally within a housing 67. A pattern of spaced apart conductive leads 68 on the carrier extends from corresponding terminals on the IC chip to the bottom of the carrier. The leads 68 on the bottom on the carrier are aligned with the plugs 26 pre-bonded to the contacts on the PCB. Heat is then applied at a temperature sufficient to bond the resin in the plugs to the pattern of conductive leads 68 on the IC chip. The bonding steps form a pattern of discrete electrically isolated conductive paths extending from circuits in the IC chip 66 through the film to corresponding contacts 64 on the PCB.

FIG. 8 schematically illustrates a further use of the film for interconnecting a leadframe 70 to a substrate such as a PCB 72. The leadframe has separate mutually spaced apart leadframe terminals 74 projecting outwardly along the side edge of an IC chip 75. The illustrated leadframe 70 also can be a spreader in this configuration. The PCB 72 has a pattern of electrical contacts 76 on its upper surface, and the film 22 first may be adhered to the upper surface of the PCB 72 so that the plugs 26 are aligned with the contacts 76 in the manner similar to the PCB 62 and the film 26 described in FIG. 7. The leadframe 70 is placed over the film 22 so that the leadframe terminals 74 are aligned with corresponding plugs 26. External heat is then applied to activate the bonding material so that the individual leads 74 from the leadframe are interconnected to corresponding contacts 76 on the PCB 72 through the film.

FIG. 9 schematically illustrates use of the film for interconnecting a pattern of electrical terminals on one electrical component to a different pattern of electrical terminals on a different electrical component. In this example, the film 22 interconnects a pattern of I/O bond pads 80 on an IC chip 82 to a different pattern of contacts 84 on the surface of a substrate such as a PCB 86. The conductive plugs 26 are arranged on the dielectric film 22 in a pattern which overlaps the pattern of I/O pads 80 and the pattern of contacts 84 so that each conductive plug 26 provides an electrical interconnect between each I/O pad and a corresponding contact on the PCB. Thus, when heat is applied to activate the resin, discrete circuit paths are formed between the pattern of I/O pads 80 and the corresponding different pattern of contacts 84.

FIG. 10 schematically illustrates use of the film for connecting a pattern of electrical components on one substrate to a different pattern of electrical conductors on another substrate. In the illustrated embodiment, one substrate comprises a first PCB 90 having a pattern of electrical contacts 92 on a face of the PCB adjacent a second PCB 94 having a different pattern of electrical contacts 96. In this embodiment, the dielectric film 22 is placed between the two PCB's and the preset pattern of conductive plugs 26 on the film is arranged so that each conductive plug overlaps a separate contact 92 on the first PCB 90 and a corresponding contact 96 on the second PCB 94.

FIG. 11 schematically illustrates connection of electrical components to a PCB 100 having a complex topography. The type of components interconnected to the PCB 100 can vary, and in the illustrated embodiment these components comprise separate IC chips 102. The complex topography of the PCB also is illustrated as an example which includes means for mounting the IC chips at different elevations on the PCB, as well as for mounting the IC chips in various orientations on the PCB. In the illustrated embodiment the PCB has a contact 104 at a first elevation and a second contact 106 at a second elevation. Both contacts 104 and 106 are shown facing upwardly at different levels on a top surface of the PCB. The PCB also can include a third contact 108 facing outwardly from a surface extending in a generally upright plane along a portion of the complex topography. The contacts 104, 106 and 108 are shown as an example only, and each contact can represent a pattern of similarly arranged contacts adapted for connection for corresponding electrical conductors or terminals such as the I/O bond IC chips 102. Electrical components such as the IC chips 102 are interconnected to the pattern of contacts on the PCB by first adhering the dielectric film 22 to the upper face of the PCB. Owing to the flexibility of the dielectric film, the film can easily be adapted to match any complex topography of the upper surface of the PCB. Moreover, the plugs 26 in the film can be prearranged in set patterns on the film to match corresponding patterns of the contacts 104, 106 and 108 located at different regions of the PCB surface. Once the film is adhered to the upper surface of the PCB, the electrical components 102 are aligned with the corresponding patterns of contacts on the PCB. Heat is then applied in a manner similar to that described previously for the other embodiments, for bonding each conductive element of each component 102 to a corresponding contact on the PCB.

The polymer film interconnect thus provides an assembly technique which allows the bonding of high lead count devices to leadframes, packages or substrates. As with wire bonding, the polymer film interconnect does not require any special chip processing. Standard metallization and passivization systems can be used. This feature provides great flexibility inasmuch as virtually any combination of electrical components can be interconnected using these polymer film interconnect techniques.

In contrast, both TAB and solder bump techniques require special chip processing to achieve barrier metal schemes and bump structures (although special metallizations may be employed with the present invention if desired). Also, once the electrical components are prepared for TAB or solder bumping, they must be interconnected using those techniques only.

The polymer film interconnect techniques of this invention possess the advantages of solder bump and area format TAB technologies. Wire bonds, on the other hand, require the I/O pads to be located only at the periphery of the silicon device. This restriction, as described previously, can limit the minimum allowable size of the device.

The polymer film interconnect technique also allows processing at temperatures well below 200° C. which is similar to those used for other interconnect methods. Also, the polymer film interconnect is used or may be used "in-mass" as are TAB and solder bumping techniques.

Electrical interconnections provided by the polymer film interconnect method also are reliable in use and can have advantages in terms of reliability when compared with previous technologies such as TAB-type bonds. In a typical TAB bond which is encapsulated in an epoxy resin, such as in a plastic-leaded chip carrier (PLCC) configuration, the resin often does not completely fill the space between the chip and the underside of the leadframe. Presence of such a void can lead to moisture condensation and trapping of impurities. Both of these conditions can act as a precursor for galvanic corrosion at the bond pad on the silicon device. The polymer film interconnect overcomes this difficulty because the dielectric film extends to the scribe line of the device.

Additionally, for fully encapsulated configurations such as post-molded PLCC's, the dielectric film can be configured to act as a stress relief cushion for the top surface of the device. This can reduce the incidence of passivization cracking which is often encountered when large dice (greater than 300 mils) are encased in epoxy resins.

Finally, as emphasized in the configurations of FIGS. 5 through 11, the polymer film interconnect techniques may be used to interconnect packages to boards (level 2) and to form multilevels in three-dimensional boards. Level 2 polymer film interconnects possess the thru-hole footprints of the package or substrate leads. In this embodiment, both leadless and leaded packages can be bonded circuit boards or substrates, thus replacing solders and solder masks.

What is claimed is:

1. A polymer film interconnect for forming an electrical interconnect between a first pattern of electrical conductors on a first electrical component and a second pattern of electrical conductors on a second electrical component, the polymer film interconnect comprising:

a thin, flexible, self-supporting dielectric polymeric carrier film provided as a free film and having a substantially planar first surface and an opposing substantially planar second surface, the carrier film having a preset pattern of mutually spaced apart plugs of an electrically conductive bonding material extending entirely through the carrier film from the first surface to the second surface thereof, the plugs of bonding material being arranged on the carrier film in a pattern corresponding to the patterns of electrical conductors on the electrical components; wherein the plugs of conductive bonding material are supported in their preset pattern by the film, are electrically isolated from each other by the film, and substantially fill respective holes in the film so that opposite end surfaces of the plugs are directly exposed to and are substantially in the plane of the first and second surfaces of the film, and wherein the carrier film and the plugs are each made of a heat-activated polymeric adhesive bonding material so that the plugs are capable of adhesion by thermally bonding to the first pattern of electrical conductors adjacent the first surface of the film and to the second pattern of electrical conductors adjacent the second surface of the film and so that at least one of the surfaces of the carrier film is capable of adhesion by thermally bonding to an adjacent nonconductive surface of one of said electrical components under externally applied heat, the polymeric adhesive bonding material contained in the conductive plugs and in the carrier film being heat activatable so the opposite end surfaces of the plugs and said one surface of the carrier film are heat bonded directly to the conductors and to the nonconductive surface of the component, respectively, the heat-activated resinous characteristics of the polymeric adhesive bonding material itself causing softening of the material, under externally applied heat at temperatures below about 200° C. and thereby substantially below the heat tolerance limits of the electrical components, and wherein contact between the respective electrical conductors, said nonconductive surface and the softened bonding material, followed by hardening of the material under a temperature reduction, rigidly bonds the electrical conductors to the respective plugs and rigidly bonds said one surface of the carrier film to said nonconductive surface for use in interconnecting the first electrical conductors to corresponding second electrical conductors associated with respective plugs of conductive material, to thereby provide a plurality of discrete electrically isolated conductive paths from the first pattern of electrical conductors through the carrier film to the second pattern of electrical conductors on the opposite side of the film, while the carrier film remains in place bonded between the first and second electrical components.

2. Apparatus according to claim 1 in which the carrier film and conductive plugs are made from a polymeric material capable of heat bonding to the adjacent non-conductive surface and to the pattern of electrical conductors substantially simultaneously under the application of external heat.

3. Apparatus according to claim 1 in which the plugs of bonding material comprise a B-stage thermosetting resin which cures under heat to bond to the electrical conductors.

4. Apparatus according to claim 1 in which the plugs of bonding material comprise a thermoplastic resin which softens under heat and rehardens to enhance adhesion between the resin and the electrical conductors and adhesion between said one surface of the film and the nonconductive surface of the component.

5. Apparatus according to claim 1 in which the plugs and the film are made from polymeric materials having thermal compatibility.

6. Apparatus according to claim 1 in which the plugs include metal particles embedded in a resinous bonding material.

7. A method for forming an electrical interconnect between a first pattern of electrical conductors on a first electrical component and a second pattern of electrical conductors on a second electrical component, the method comprising the steps of:

providing a thin, flexible, self-supporting dielectric polymeric carrier film as a free film having a preset pattern of mutually spaced apart plugs of electrically conductive bonding material extending entirely through the carrier film from a substantially planar first surface of the carrier film to an opposite second surface of the carrier film; the plugs of conductive bonding material being supported in their preset pattern by the film, electrically isolated from each other by the film, and substantially filling respective holes in the film so that opposite end surfaces of the plugs are directly exposed to and substantially in the plane of the first and second surfaces of the film, and in which the carrier film and the plugs are each made of a heat-activated polymeric adhesive bonding material;

placing the carrier film between the first and second electrical components so the pattern of conductive plugs is aligned with and contacts the first pattern of conductors adjacent the first surface of the film and is aligned with and contacts the second pattern of conductors adjacent the second surface of the film, and at least one surface of the carrier film contacts an adjacent nonconductive surface of one of said electrical components;

applying heat so as to thermally activate the polymeric adhesive bonding material of the plugs and the carrier film to bond said one surface of the film to said nonconductive surface of the electrical component and to bond the first and second patterns of electrical conductors to respective conductive plugs, the polymeric adhesive bonding material contained in the conductive plugs and the carrier film being heat activatable so the opposite end surfaces of the plugs and said one surface of the carrier film are heat bonded directly to the conductors and to the nonconductive surface of the component, respectively, the heat-activated resinous characteristics of the polymeric adhesive bonding material itself causing softening of the material under externally applied heat at temperatures below about 200° C. and thereby substantially below the heat tolerance limits of the electrical components, and wherein contact between the respective electrical conductors, said nonconductive surface, and the softened bonding material is followed by hardening of the bonding material under a temperature reduction that rigidly bonds the electrical conductors to the respective plugs and rigidly bonds said one surface of the carrier film to said nonconductive surface to thereby form a plurality of discrete electrically isolated conductive paths from the first pattern of electrical conductors through the carrier film to the second pattern of electrical conductors on the opposite side of the film, while the carrier film remains in place bonded between the first and second components.

8. The method according to claim 7 in which the plugs of bonding material comprise a B-shaped thermosetting resin which cures under heat to bond to the electrical conductors.

9. The method according to claim 7 in which the plugs of bonding material comprises a thermoplastic resin which softens under heat and re-hardens to enhance adhesion between the resin and the electrical conductors.

10. The method according to claim 7 in which the first component comprises an integrated circuit chip and the second component comprises a circuit board.

11. The method according to claim 7 in which the film comprises an intermediate film positioned between a first similar film on the first side of the intermediate film and a second similar film on the second side of the intermediate film, and in which the pattern of bonding material in the first film is different from the pattern of bonding material in the second film; and including the steps of heat bonding the pattern of bonding material in the first film to the first electrical conductors and heat bonding the pattern of bonding material in a second film to the second electrical conductors, the quantities of bonding material in the intermediate film being bonded to corresponding patterns of bonding material in the first and second films to provide a continuous electrical transition from corresponding first electrical conductors through the films to corresponding second electrical conductors on an opposite side of the film.

12. The method according to claim 7 in which the carrier film and conductive plugs are made from a polymeric material capable of heat bonding to the adjacent non-conductive surface and to the pattern of electrical conductors substantially simultaneously under the application of external heat.

13. The method according to claim 7 in which the polymeric materials contained in the conductive plugs and the carrier film are heat activatable at less than about 200° C.

14. A method according to claim 7 in which the first electrical component comprises a semi-conductor wafer; and in which the electrical interconnect is heat bonded to a multiplicity of said first electrical components contained on the wafer, followed by subdividing the wafer into individual ones of said first electrical components, and then by heat bonding each of said first electrical components and its corresponding polymer film interconnect to a corresponding second electrical component.

* * * * *